US006830984B2

(12) United States Patent
Schultz et al.

(10) Patent No.: US 6,830,984 B2
(45) Date of Patent: Dec. 14, 2004

(54) THICK TRACES FROM MULTIPLE DAMASCENE LAYERS

(75) Inventors: Richard T. Schultz, Fort Collins, CO (US); Peter J. Wright, Sunnyvale, CA (US)

(73) Assignee: LSI Logic Corporation, Milpitas, CA (US)

(*) Notice: Subject to any disclaimer, the term of this patent is extended or adjusted under 35 U.S.C. 154(b) by 338 days.

(21) Appl. No.: 10/078,233

(22) Filed: Feb. 15, 2002

(65) Prior Publication Data

US 2003/0157805 A1 Aug. 21, 2003

(51) Int. Cl.[7] .............................................. H01L 21/20
(52) U.S. Cl. ...................... 438/393; 438/396; 257/243; 257/300
(58) Field of Search ........................ 438/238, 250–253, 438/393–399; 257/243, 295, 300, 531, 532, 758, 774

(56) References Cited

U.S. PATENT DOCUMENTS

| 6,649,464 | B2 | * | 11/2003 | Lee ............................. 438/238 |
| 6,670,237 | B1 | * | 12/2003 | Loh et al. .................... 438/253 |
| 6,680,514 | B1 | * | 1/2004 | Geffken et al. ............. 257/368 |
| 6,680,520 | B2 | * | 1/2004 | Voldman et al. ............ 257/532 |
| 6,680,542 | B1 | * | 1/2004 | Gibson et al. .............. 257/774 |
| 6,710,425 | B2 | * | 3/2004 | Bothra ........................ 257/532 |
| 6,734,477 | B2 | * | 5/2004 | Moise et al. ................ 257/295 |

* cited by examiner

*Primary Examiner*—Duy-Vu Deo
(74) *Attorney, Agent, or Firm*—Cochran, Freund & Young, LLC

(57) ABSTRACT

Multiple damascene layers in integrated circuits can form several advantageous designs or components that may lower cost or increase performance of certain designs. In embodiments for power bus signals, multiple damascene layers may be used to form traces with increased power capacity and lower cost. In other embodiments, multiple damascene layers may be used to form components such as capacitors and inductors with increased performance.

5 Claims, 12 Drawing Sheets

THICK TRACES FROM MULTIPLE DAMASCENE LAYERS

BACKGROUND OF THE INVENTION a. Field of the Invention

The present invention pertains generally to the processing of integrated circuits and more specifically to the processing of copper integrated circuits.

b. Description of the Background

As the density of components increase on an integrated circuit, the supply of power becomes more critical to the proper functioning of the device. As the power supply needs increase, the size of the power supply traces need to increase as well.

With conventional processing methods of integrated circuits, there is a practical limit to the thickness of the trace. Additionally, the width of a trace can be limited by processing limitations and by the available planar area or real estate available. Such limits force a designer to dedicate more than one layer of traces to one specific power supply path, placing vias in between the multiple layers. Such a design requires several processing steps to complete the manufacturing process and thereby increases the cost of the integrated circuit.

Several types of components, such as capacitors and inductors, are difficult to manufacture using existing processing techniques. These devices are limited in their performance by the thickness of the traces from which they are fabricated.

It would therefore be advantageous to provide designs and methods of fabrication for thick circuit traces. It would further be advantageous to provide thick traces at lower processing costs than conventional designs. Thick traces may also enhance the performance of capacitors and inductors in integrated circuits.

SUMMARY OF THE INVENTION

The present invention overcomes the disadvantages and limitations of the prior art by providing a method for the creation of special thick traces. The thick traces may reduce the processing time and thus cost of the fabrication of integrated circuits as several steps may be eliminated. Further, the thick traces may be formed by using a photomask reticule more than once, reducing the tooling cost for an integrated circuit.

Certain components may be fabricated using the inventive thick traces. For example a capacitor may be fabricated in an integrated circuit with enhanced capacitance and greater performance. Inductors may likewise be created that have increased inductance using the inventive thick traces.

The present invention may therefore comprise a method for forming a thick signal trace in an integrated circuit comprising: forming a first layer of dielectric; etching the first layer of dielectric to form a first trench using a first pattern; filling the first trench with a conductive material to form a first electrical trace having a top surface; forming a second layer of dielectric; etching the second layer of dielectric to form a second trench using a second pattern, the second trench substantially fully exposing the top surface of the first electrical trace; and filling the second trench with the conductive material forming a second electrical trace having a bottom surface substantially conterminous with the top surface of the first trace.

The present invention may further comprise a trace in an integrated circuit formed by a process that comprises: forming a first layer of dielectric; etching the first layer of dielectric to form a first trench; filling the first trench with an encapsulating material; filling the first trench with a conductive material to form an electrical trace having a top surface; forming a second layer of dielectric; etching the second layer of dielectric to form a second trench, the second trench substantially exposing the top surface of the electrical trace; filling the second trench with encapsulating material; filling the second trench with the conductive material forming a second electrical trace having a bottom surface substantially coterminous with the top surface of the electrical trace; and covering the conductive material with the encapsulating material.

The present invention may further comprise a power trace in an integrated circuit comprising: a first conductor being formed in an dielectric layer and having a top surface, the first conductor having an encapsulant formed on the bottom and sides of the first conductor; a second conductor, the second conductor having a bottom surface formed conterminous with the top surface of the first conductor, the second conductor having an encapsulant formed on the bottom and sides of the second conductor; the dielectric material being selected to effect the capacitive coupling of the power trace.

The present invention may further comprise a capacitor in an integrated circuit comprising: a first signal trace and a second signal trace fabricated in at least one signal layer, the signal layer having a first dielectric material having a first dielectric material; at least two electrodes, each electrode being formed in a plurality of successive electrode layers comprising a second dielectric material; the electrodes being comprised of conductors formed in said successive layers, each of the conductors having a top surface and a bottom surface wherein the bottom surface is conterminous with the top surface for each of the successive layers; and wherein the first signal trace and the second signal trace are connected to alternating electrodes.

The present invention may further comprise an inductor in an integrated circuit comprising: successive layers comprising a top layer, at least one intermediate layer, and a bottom layer; the intermediate layer comprising a plurality of concentric loops, each loop being disunited at two points substantially opposite each other; the loops being comprised of conductors formed in the successive layers, each of the conductors having a top surface and a bottom surface wherein the bottom surface is conterminous with the top surface for each of the successive layers; and the top layer further comprising at least one trace connecting at least two of the concentric loops.

The present invention may further comprise an inductor in an integrated circuit comprising: a coiled trace formed in a plurality of successive layers, the coiled trace being comprised of conductors in successive layers, each of said conductors having a top surface and a bottom surface wherein the bottom surface is conterminous with the top surface for each of the successive layers, the layers further comprising a first non-conductive material, the coiled trace having a first end and a second end; a first signal trace and a second signal trace in a signal layer, the signal layer comprising a second non-conductive material; the first signal trace being in electrical communication with the first end of the coiled trace; and the second signal trace being in electrical communication with the second end of the coiled trace.

The advantages of the present invention are that increased power capacity in power supply traces may be achieved with a minimum of processing steps. Further, higher performance capacitors and inductors may be created using conventional processing steps.

DETAILED DESCRIPTION OF THE INVENTION

Figure 1:
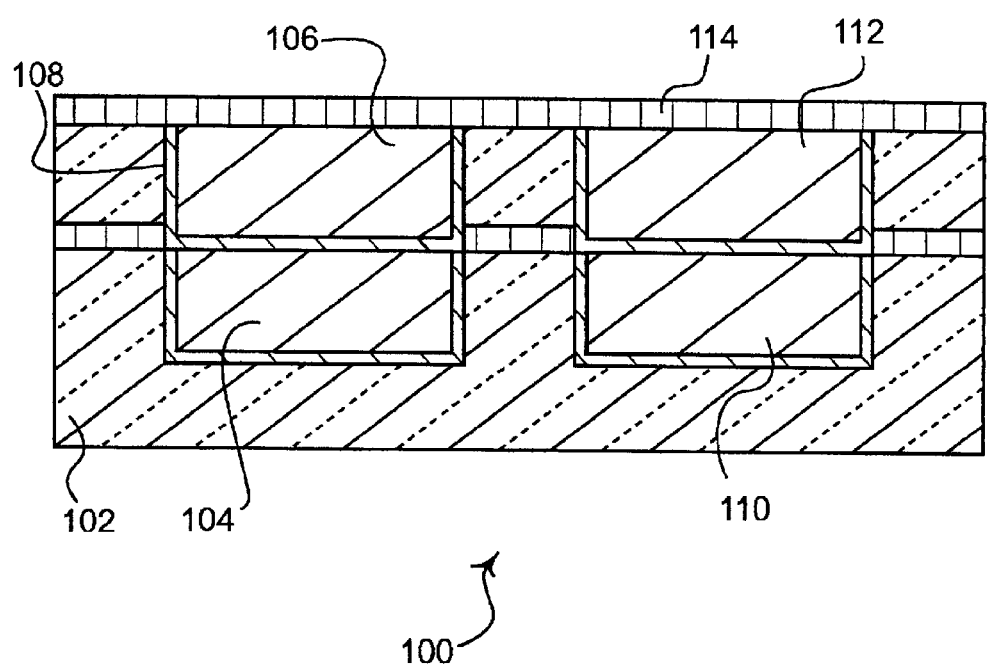
FIG. 1 is a cross-sectional view of an embodiment of the present invention.

FIG. 1 is an illustration of a cross section of an embodiment 100 of the present invention. Illustrated is a portion of an integrated circuit with the dielectric 102, a first copper trace 104, and a second copper trace 106. Both copper traces 106 and 104 are encapsulated with a tantalum nitride encapsulant 108. A second set of traces 110 and 112 with silicon nitride encapsulant 114 are formed at the same time as traces 104 and 106.

The present invention has two traces placed directly over each other forming a thicker layer than can be manufactured in one step. In general, each layer would be deposited as thick as possible. There are conventional processing limitations to the thickness of each layer. The resultant dual layer design has a combined resistance that is lower than a single layer design. Additionally, the dual layer design has a higher current capacity.

The present invention relies on the maximum thickness that is practically possible with any integrated circuit construction. As the thickness of the layers increases, stress and other processing considerations, such as planarity and dishing, may become limiting factors. The present invention allows traces to be fabricated thicker than conventionally possible with conventional manufacturing techniques.

The present embodiment 100 uses copper traces, but the present invention is not limited to copper traces. For example, the same concept may be applied to aluminum traces or to any new integrated circuit technologies as they are developed. The present embodiment 100 of the present invention is merely for illustration purposes, and other technologies, methods, and construction techniques may be used by those skilled in the art while keeping within the scope and spirit of the present invention.

It is common practice to have multiple layers of power bus lines to facilitate the larger power requirements of the power traces. In such designs, a wide trace would be placed over a second wide trace, separated by a dielectric layer and be connected with vias. The disadvantage of the prior art is the extra processing steps required to add the vias and may significantly add cost to the integrated circuit.

FIGS. 2A through 2K illustrate an embodiment of a manufacturing process used for fabricating the inventive thick traces.

Figure 2A:
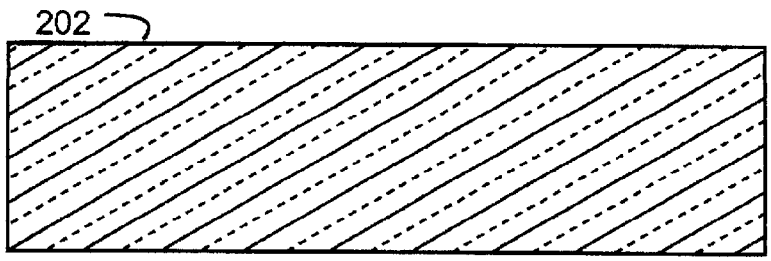
FIGS. 2A through 2L illustrate an embodiment of a manufacturing process used for fabricating the inventive thick traces.

FIG. 2A illustrates a dielectric layer 202 of an integrated circuit. Such a dielectric layer may be deposited by any of a number of methods such as chemical vapor deposition, plasma vapor deposition, or other dielectric film deposition processes.

Figure 2B:
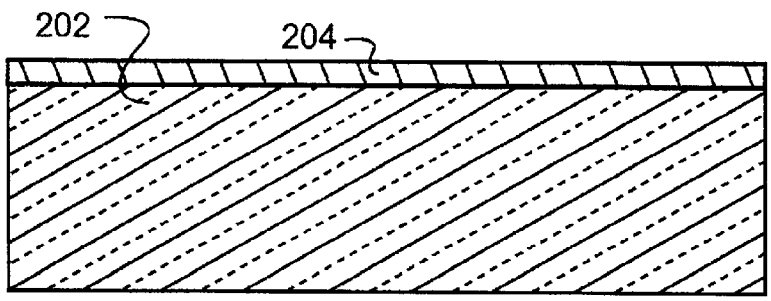

FIG. 2B illustrates a dielectric layer 202 with a photomask layer 204 deposited on top.

Figure 2C:
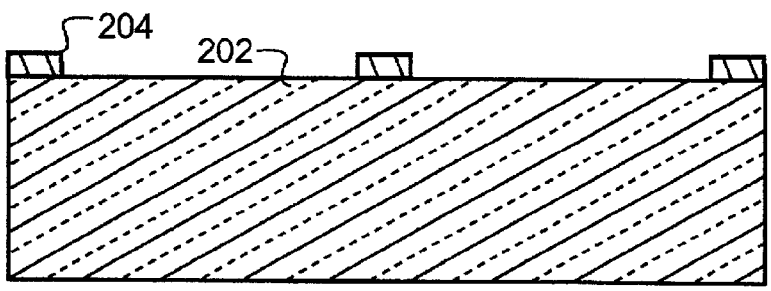

FIG. 2C illustrates the photomask layer 204 having been exposed and developed, with portions removed.

Figure 2D:
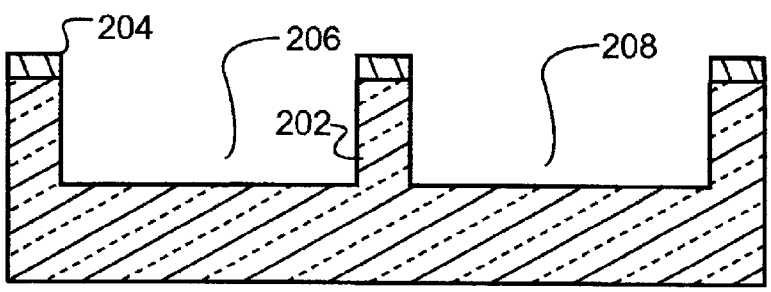

FIG. 2D illustrates the dielectric layer 202 having been chemical or plasma etched to form two troughs, 206 and 208.

Figure 2E:
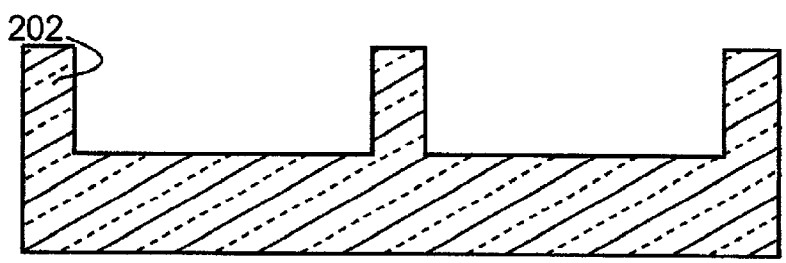

FIG. 2E illustrates the dielectric layer 202 having had the photomask layer removed.

Figure 2F:
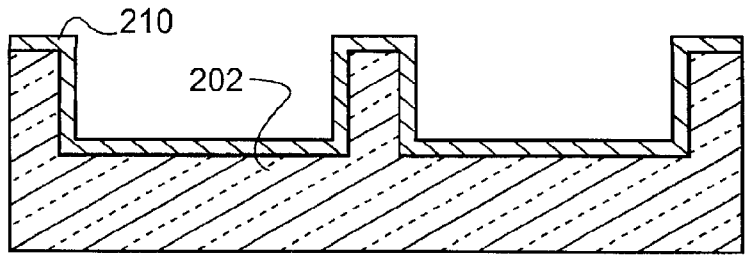

FIG. 2F illustrates the dielectric layer 202 having had a layer of encapsulant 210 applied over the surface of the dielectric layer 202. The encapsulant 210 may be applied by chemical vapor deposition, plasma vapor deposition, or other method of deposition.

Figure 2G:
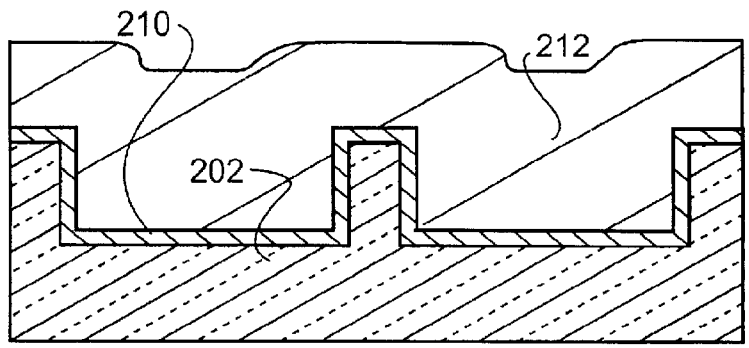

FIG. 2G illustrates the dielectric layer 202 and encapsulant 210 having a layer of metal 212, such as copper, applied over the encapsulant 210. The metal 212 may be deposited by electroplating or other deposition methods.

Figure 2H:
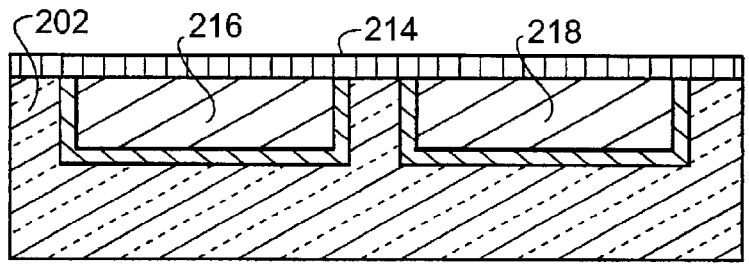

FIG. 2H illustrates dielectric layer of FIG. 2G, wherein the excess metal 212 and encapsulant 210 are removed down to the layer of the dielectric 202. Further, an additional layer of etch stop or dielectric barrier 214 is applied above the metal traces 216 and 218.

Figure 2I:
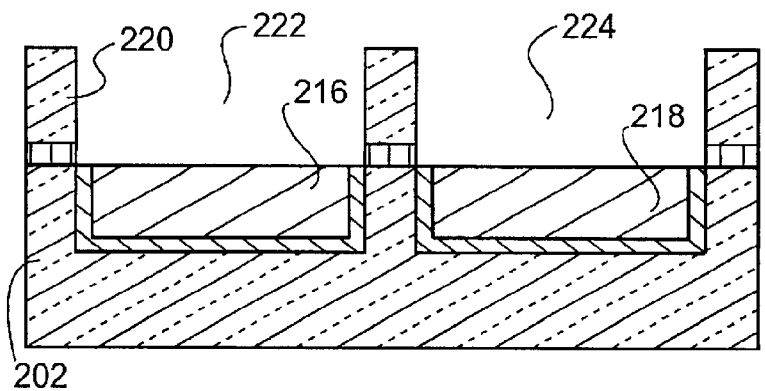

FIG. 2I illustrates the dielectric layer of FIG. 2H, with a second layer of dielectric 220 applied and etched to form two additional troughs 222 and 224 above the metal traces 216 and 218.

Figure 2J:
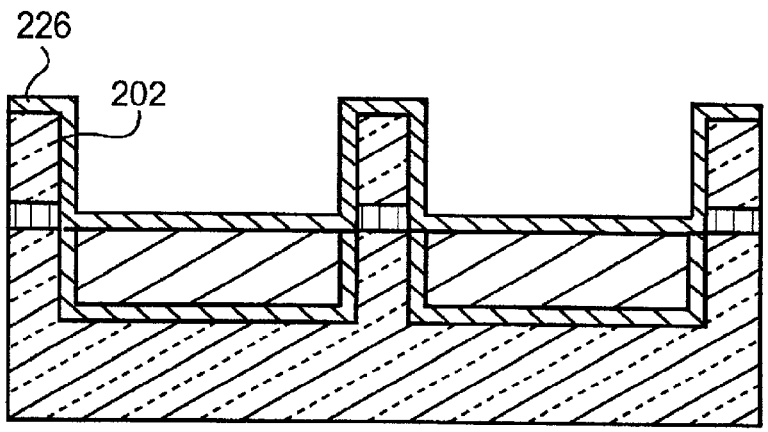

FIG. 2J illustrates the dielectric layer of FIG. 2I having had a layer of encapsulant 226 applied to the top surface.

Figure 2K:
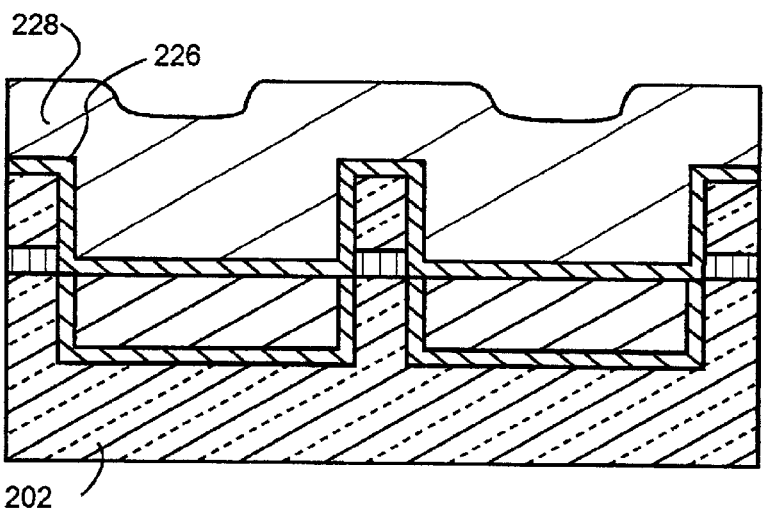

FIG. 2K illustrates the dielectric layer of FIG. 2J having had a layer of metal 228 applied over the encapsulant 226.

Figure 2L:
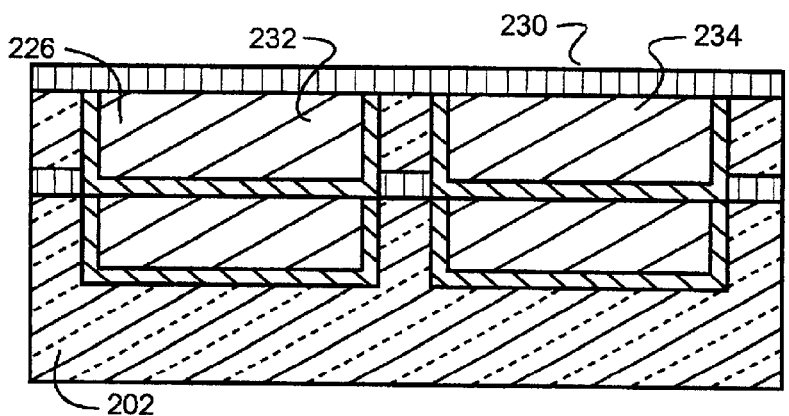

FIG. 2L illustrates the dielectric layer of FIG. 2K having had the excess metal 228 and encapsulant 226 removed down to the layer of the dielectric 202. Further, an additional layer of etch stop or dielectric barrier 230 is applied above metal traces 232 and 234. FIGS. 2I through 2L represent a process for forming a single damascene layer.

The manufacturing steps illustrated in FIGS. 2A through 2L are conventional processing steps used in the manufacture of copper based integrated circuits. For example, the encapsulants 210 and 226 may be tantalum nitride or other suitable barrier to prevent the migration of the conductive metal into the dielectric substrate. The etch stop or dielectric barrier layers 214 and 230 may be formed of silicon nitride, silicon carbide, silicon carbon nitride, or other materials used as etch stop or dielectric barrier layers. The steps of removing excess metal and encapsulant, such as in FIGS. 2H and 2J, may be accomplished with a standard chemical/mechanical polish process. In some embodiments, other processes and layers, such as etch stop or dielectric barrier layers may be used to facilitate other fabrication processes. The manufacturing steps illustrated in FIGS. 2A through 2J may be adapted to other manufacturing technologies by those skilled in the art.

In some applications, the placement of the second layer of the thick traces may be accomplished with the same photomask reticule for both layers. In such a case, the cost of a second photomask reticule can be avoided, lowering the tooling cost for a new integrated circuit.

Figure 3:
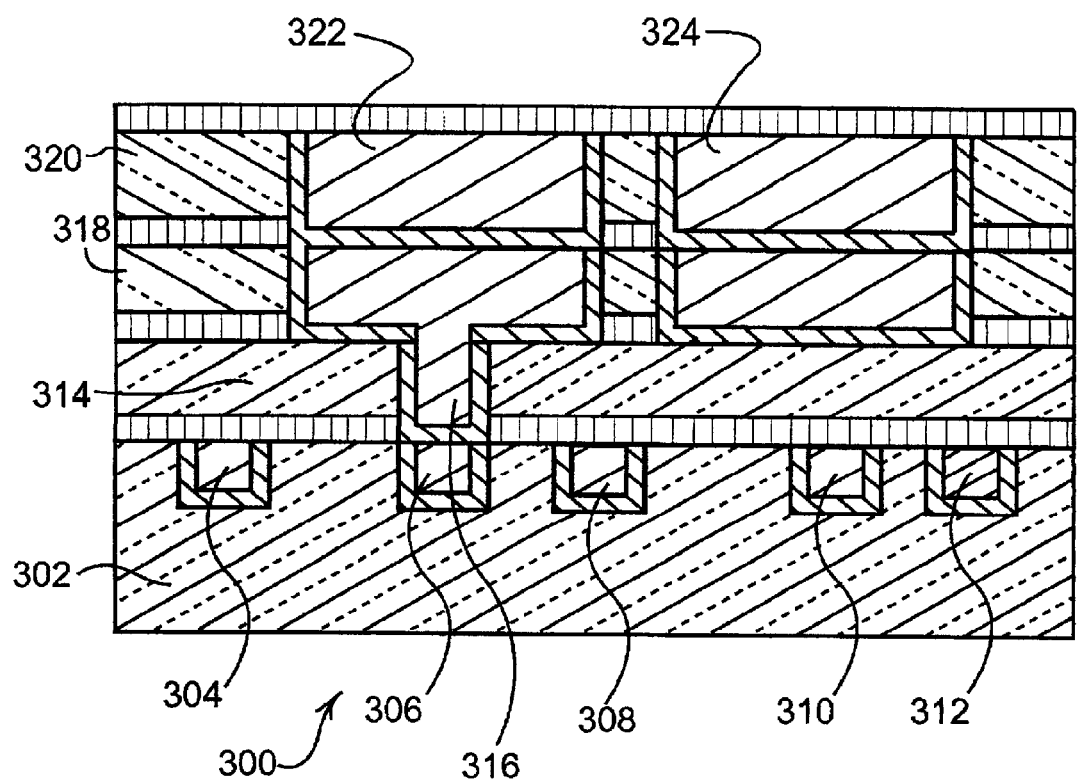
FIG. 3 illustrates another embodiment of the present invention.

FIG. 3 illustrates an embodiment 300 of the present invention. A layer of low dielectric constant (K) dielectric 302 contains several signal traces 304, 306, 308, 310, and 312. Another layer of low K dielectric 314 is above dielectric 302, through which a via 316 is formed. Two layers of high K dielectric 318 and 320 contain the dual thickness power bus traces 322 and 324.

The present embodiment 300 has low K dielectric between the signal traces to minimize capacitive coupling, and high K dielectric between the power bus traces 322 and 324. The high dielectric constant material in the power bus layers works to provide additional capacitance which minimizes VDD droop during peak dynamic current loads.

The geometry of the power bus traces 322 and 324 are selected to provide the desired current carrying capacity. In general, the greater thickness provides a lower resistance and the wider the trace, the lower the resistance. The practical limitations are that as the width of the power bus trace increases, the amount of real estate or planar surface area consumed by the metal traces is increased. In the industry, common rules of thumb have been established that specify the desired ratio of dielectric to metal for each layer. In cases where the width of the traces cannot be increased due to the above limitations, the inventive traces fabricated from multiple thicknesses may be desired.

The embodiment 300 illustrates the inventive design executed with two damascene layers. It would be clear to those skilled in the art that the present invention may be executed with more than two damascene layers. For example, power bus traces formed of three or more layers may be practical, and would be keeping within the spirit and intent of the present invention.

Figure 4:
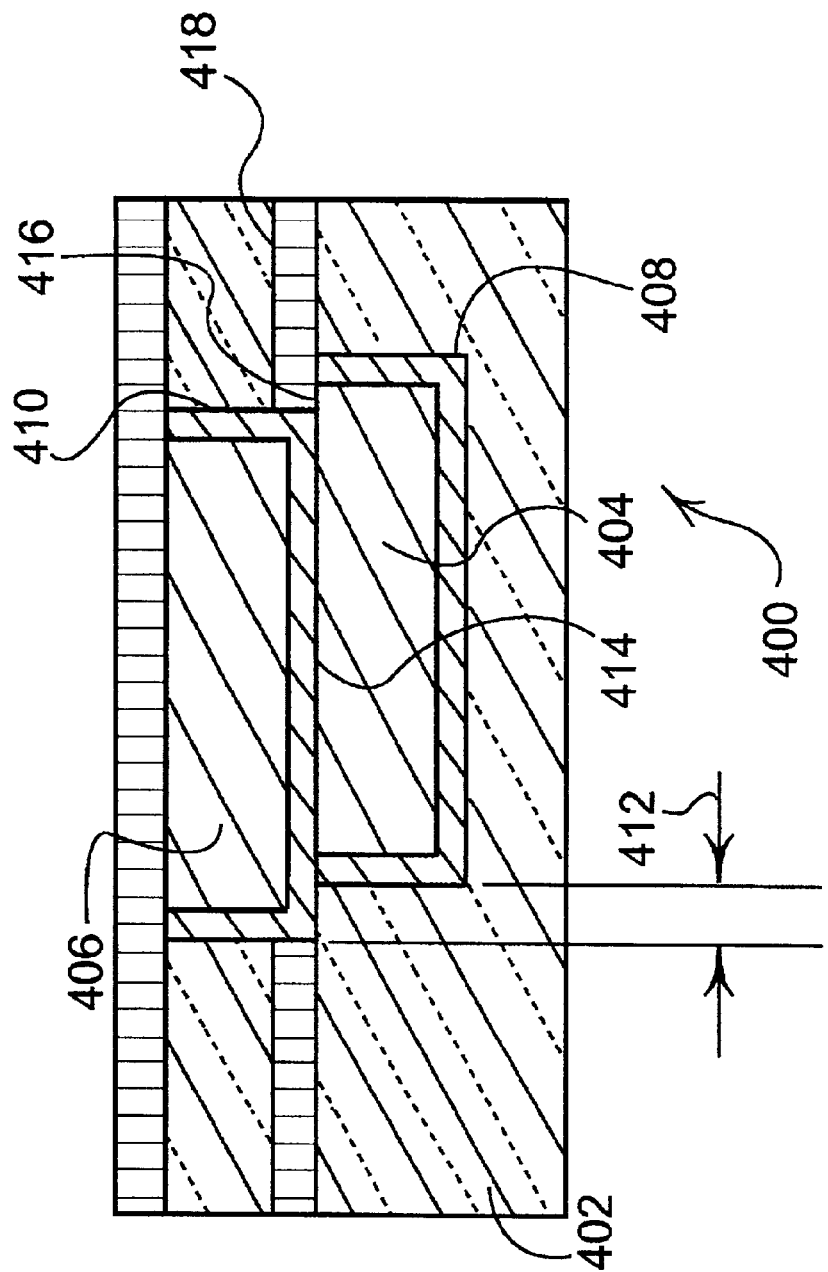
FIG. 4 illustrates another embodiment of the present invention wherein the effects of a registration tolerance are illustrated.

FIG. 4 illustrates an embodiment 400 of the present invention wherein the effects of a registration tolerance are illustrated. The dielectric material 402 contains two traces 404 and 406 placed on top of each other. Each trace 404 and 406 have encapsulant 408 and 410 encircling the respective trace.

The second trace 406 is offset from the first trace 404 by the distance 412, representing the mismatch of the registration of the two traces. Such mismatch is normal during the manufacturing process and must be taken into account. During the manufacturing process, the encapsulant 408 for the first trace 404 is deposited on the bottom and sides in one process step, then the top layer 414 in another process step. In the present embodiment, if the etch stop or dielectric barrier layer 418 were not present, the metal trace 404 would be exposed to the dielectric 402 in the area 416. Area 416 would then be susceptible to having the metal material of trace 406 migrate into the dielectric 402, creating a failure mechanism for the integrated circuit.

Figure 5A:
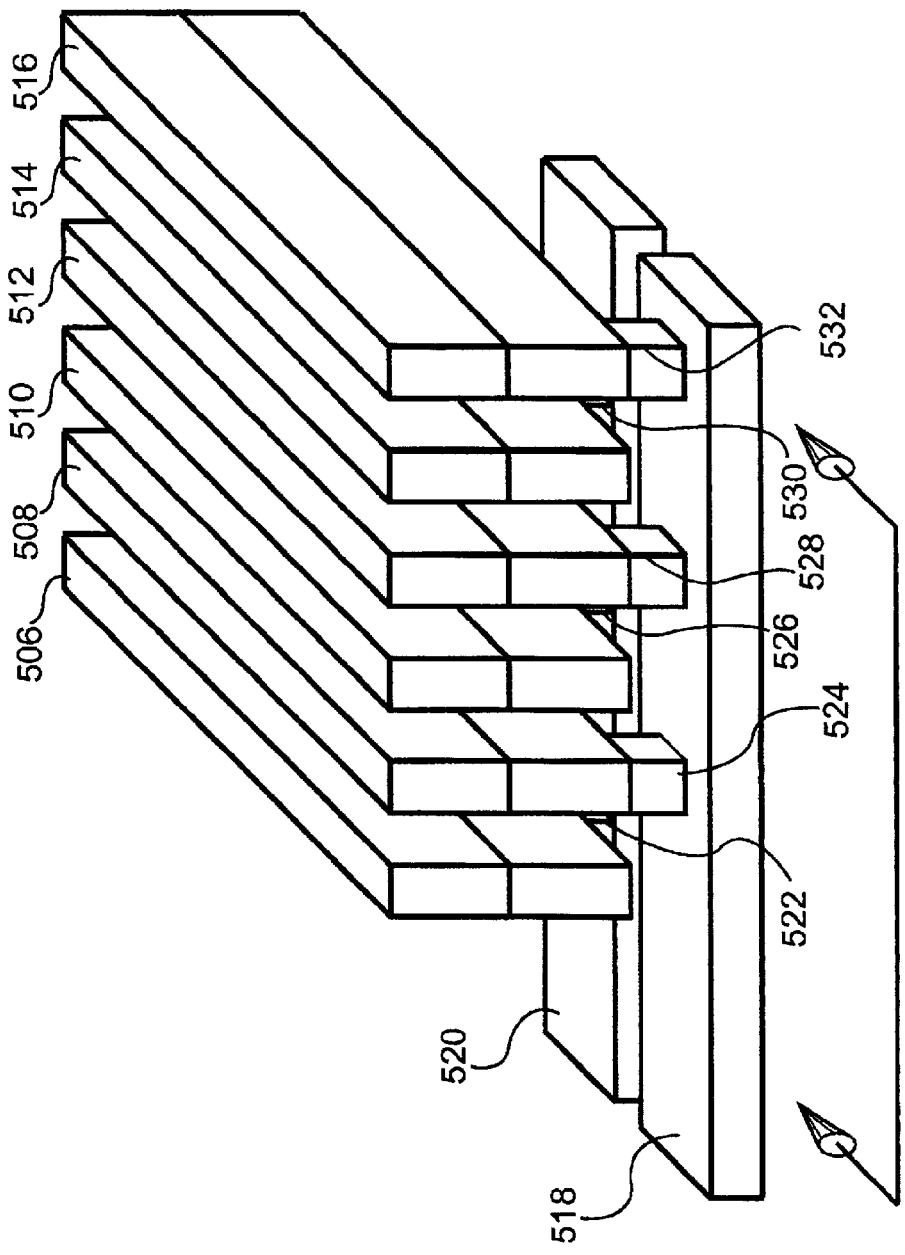
FIG. 5A illustrates an embodiment of a capacitor that is fabricated using the inventive multiple damascene layers.
Figure 5B:
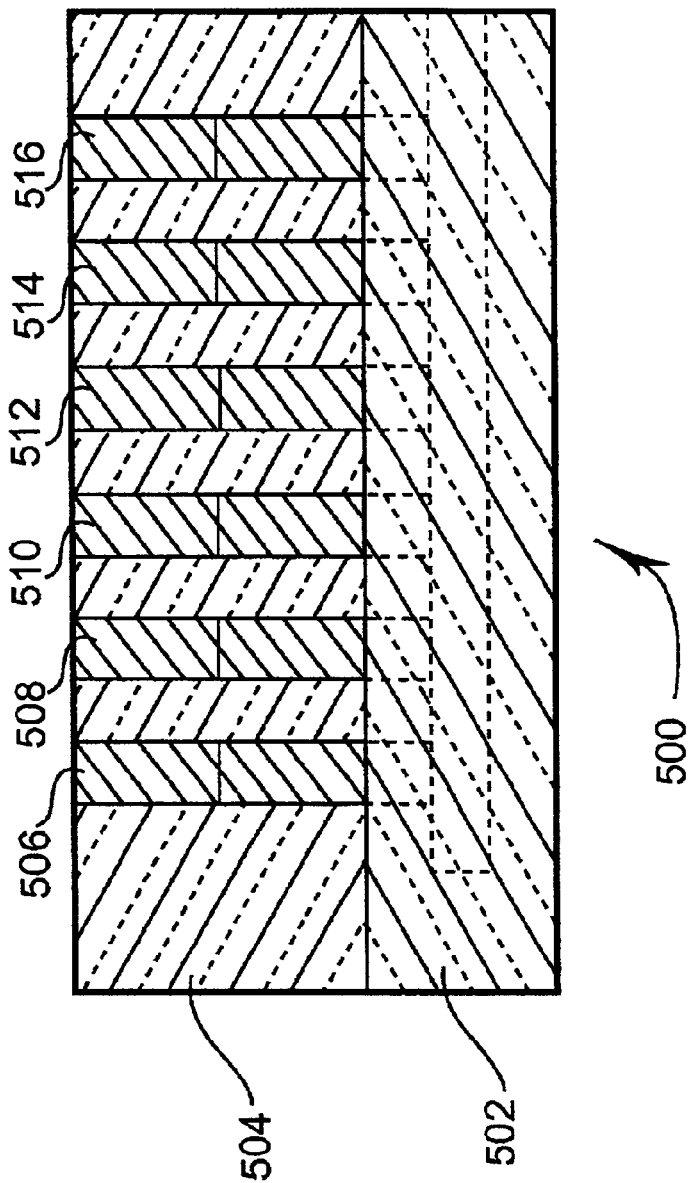
FIG. 5B is a cross-sectional view of the capacitor of FIG. 5A.

FIG. 5 illustrates an embodiment 500 of a capacitor that is fabricated using the inventive multiple damascene layers. FIG. 5B is a cross sectional illustration of embodiment 500. The dielectric 502 and 504 are shown removed in FIG. 5A for clarity. The embodiment 500 is comprised of six electrodes, 506, 508, 510, 512, 514, and 516. The electrodes are alternatively connected to signal paths 518 and 520 by vias 522, 524, 526, 528, 530, and 532.

In operation, the embodiment 500 may have a positive charge on signal path 518 and a negative charge on signal path 520. The plates 508, 512, and 516 would therefore be positively charged and the electrodes 506, 510, and 514 would be negatively charged. A capacitor would thereby be fabricated.

The dielectrics 502 and 504 may be selected to improve the performance of the capacitor of embodiment 500. For example, dielectric 502 may be selected to be a high K dielectric to minimize capacitive coupling between signal lines. Dielectric 504 may be selected to be a low dielectric constant to maximize the performance of the capacitor of embodiment 500.

The illustrated capacitor was formed using two damascene layers. In other embodiments, three or more layers may be used to create a capacitor. The foregoing example of two damascene layers was made for illustrative purposes. Those skilled in the art will appreciate that three or more damascene layers may be used to create other embodiments without violating the spirit and intent of the present invention.

Figure 6:
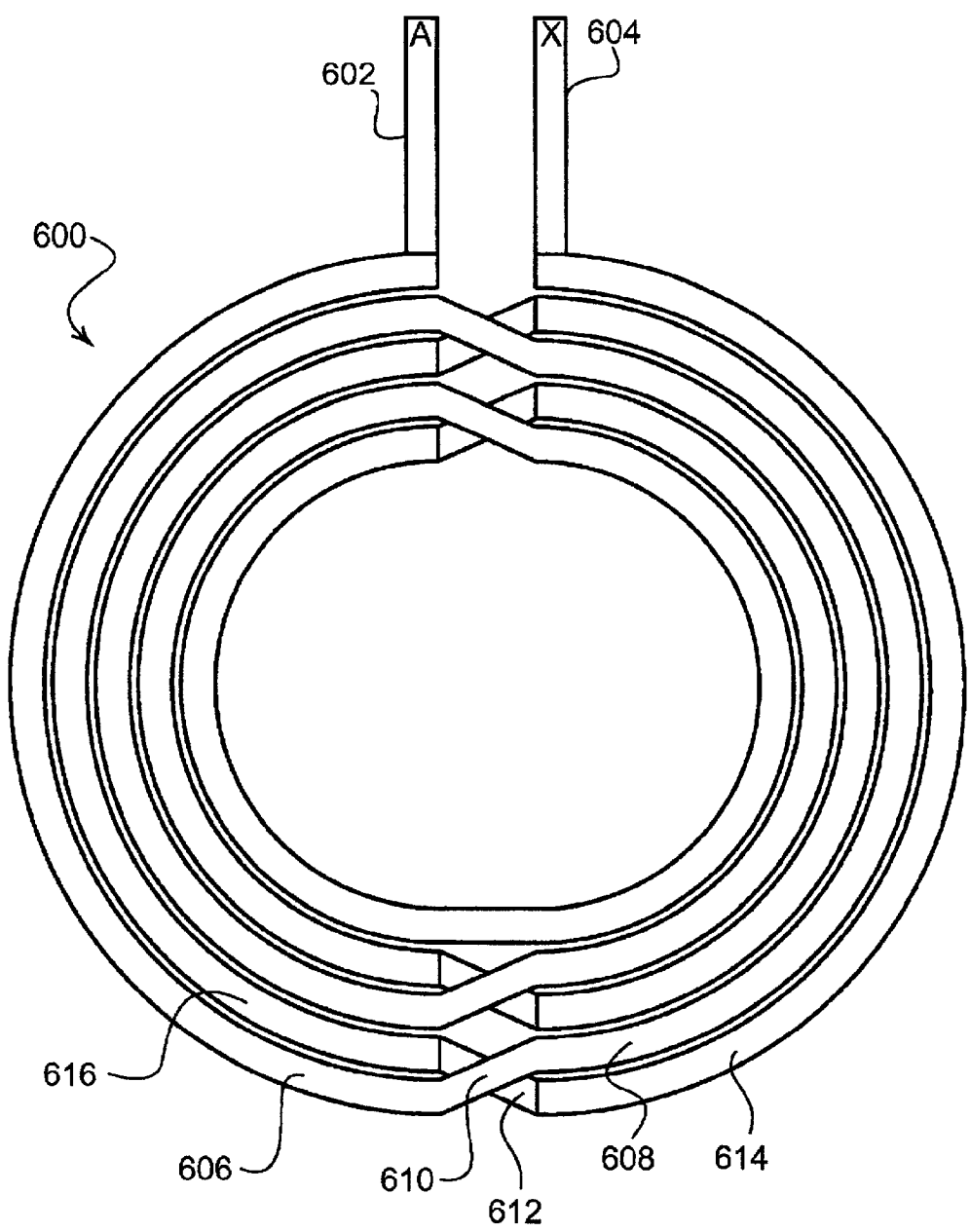
FIG. 6 illustrates a top view of a first embodiment of an inductor that is fabricated using the inventive multiple damascene layers.

FIG. 6 illustrates a top view of an embodiment 600 of an inductor that is fabricated using the inventive multiple damascene layers.

Figure 7:
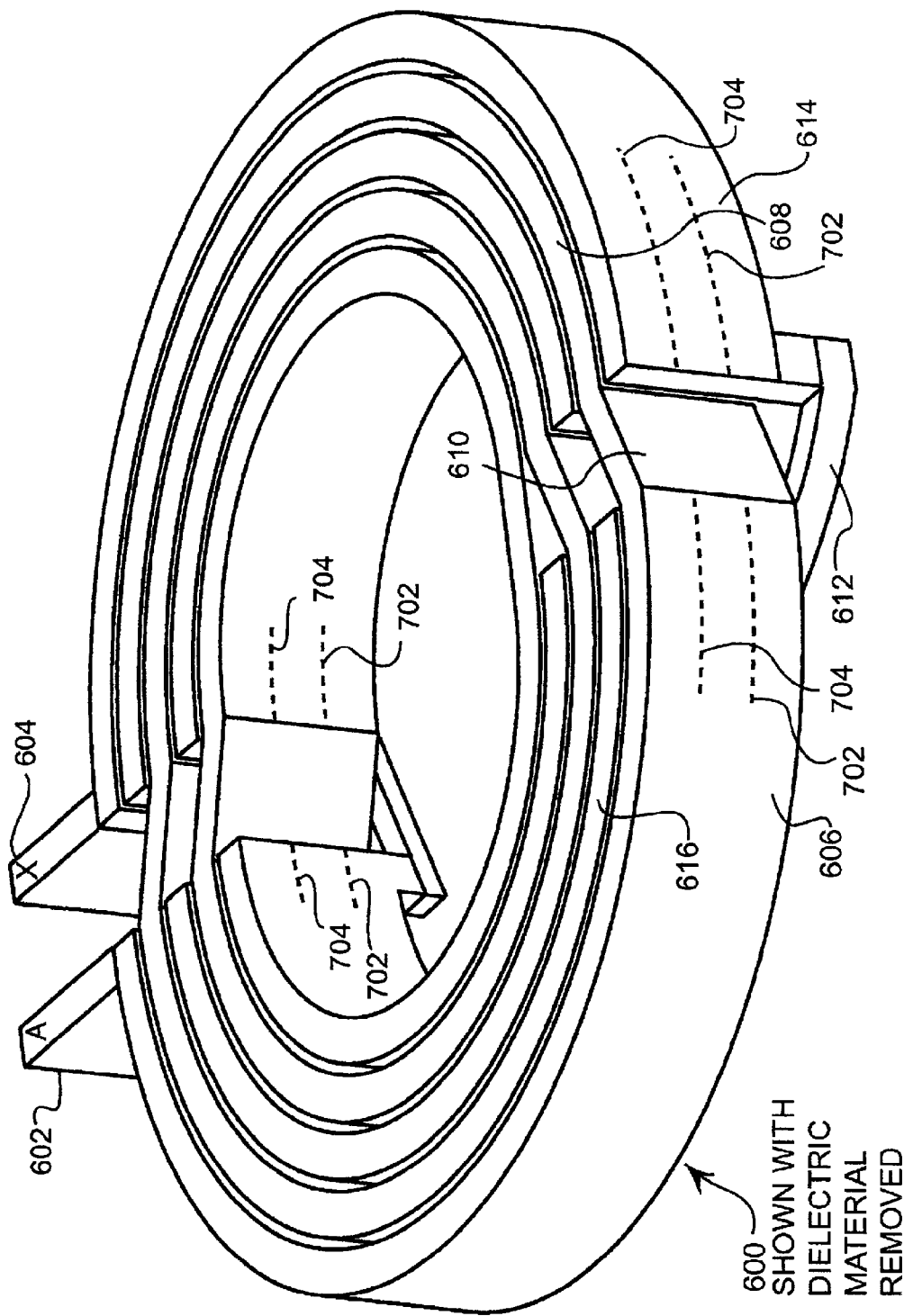
FIG. 7 illustrates a perspective view of the embodiment of FIG. 6 shown with dielectric material removed.

FIG. 7 illustrates a perspective view of embodiment 600 shown with dielectric material removed.

Embodiment 600 has an A signal conductor 602 and an X signal conductor 604. The signal paths are serpentine and flow in a counter clockwise direction. The outer A path 606 crosses over to the next inner circle 608 by a bridge 610. Likewise, the bridge 612 connects the outer X path 614 to the next inner circle 616. In a similar manner, all of the semicircular paths are connected.

Embodiment 600 is manufactured in three full damascene layers. The first layer is defined by the line 702, and forms the bottom one third of the embodiment 600. The second layer is defined between line 702 and line 704 and is formed with the same pattern or reticule. The third layer is defined above line 704 and is likewise formed with the same pattern or reticule.

A bridge 612 is formed in a lower layer than the layer defined by line 702 and connects the alternating concentric rings as shown.

The second layer, between line 702 and line 704 may alternatively be fabricated from several damascene layers to create a taller inductor. Such an embodiment may have increased performance over the present embodiment.

The advantages of the present embodiment are the increased vertical geometry of the conductors within the inductor, which increase performance of the inductor. Additionally, the dielectric material used may be selected to further increase the inductance of the inductor.

Figure 8:
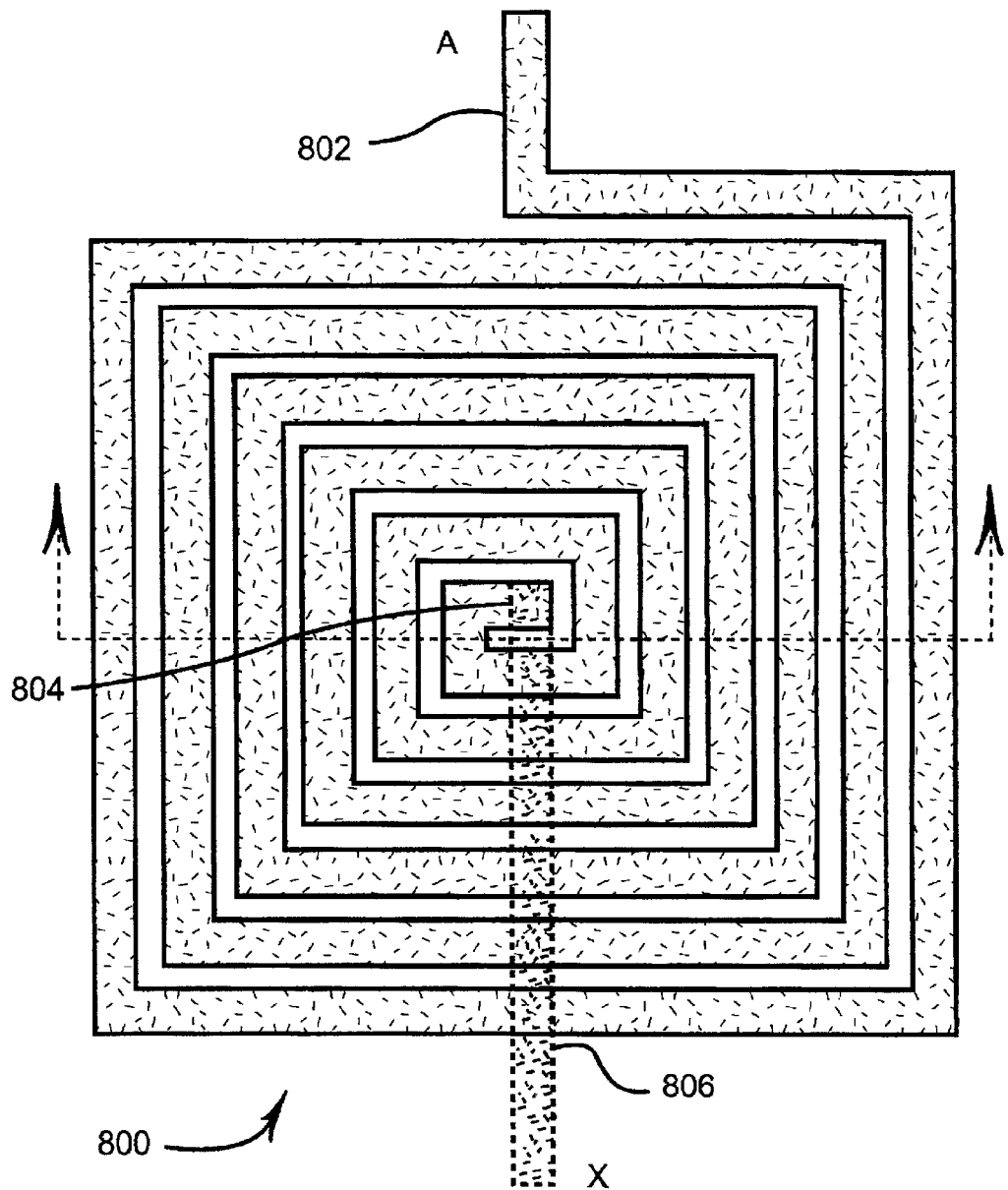
FIG. 8 illustrates a top view of a second embodiment of an inductor.

FIG. 8 illustrates a top planar view of a second embodiment 800 of an inductor. The A path 802 begins a spiral path that culminates at the center 804, and the X path 806 is brought out on a lower layer. The area from the A path 802 to the center 804 is fabricated from multiple single damascene layers.

Figure 9:
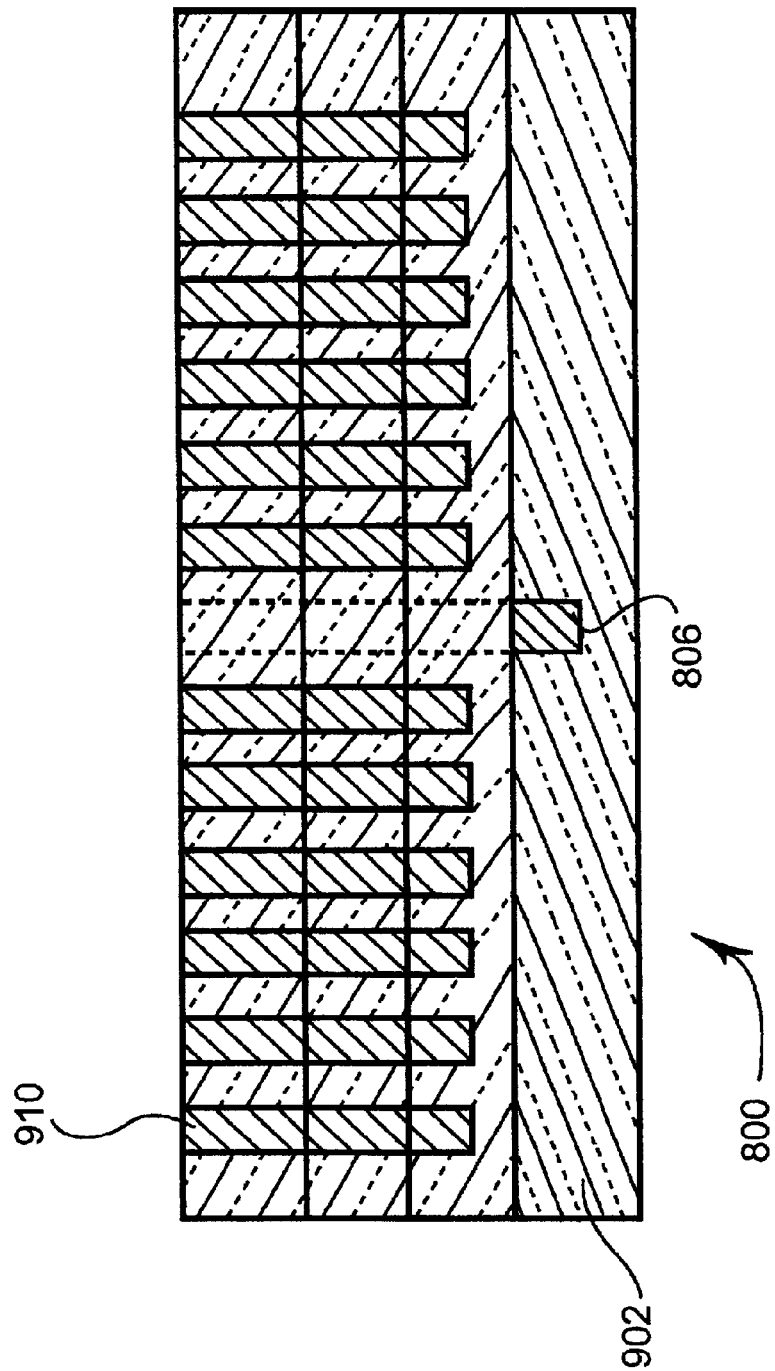
FIG. 9 illustrates a cross-sectional view of the embodiment of FIG. 8.

FIG. 9 illustrates a cross-sectional view of embodiment 800 taken across the section line in FIG. 8. A first layer of dielectric 902 may contain the X path 806. The second through fourth layers of dielectric 904, 906, and 908, contain the spiral path of the inductor. A conductor 910 is typical of the spiral path.

In the present embodiment, only the dielectric and conductor material are shown. Other materials, including encapsulants, etch stop or dielectric barrier layers, and other materials are not shown for clarity. It will be understood by those skilled in the art that the basic design of the inductor is applicable to several materials and manufacturing processes.

The dielectric 902 and the dielectrics 904, 906, and 908 may be selected to improve the performance of the inductor of embodiment 800. For example, dielectric 902 may be selected to minimize capacitive coupling between signal lines. Dielectrics 904, 906, and 908 may be selected to maximize the performance of the capacitor of embodiment 800.

The advantages of the present embodiment are the increased vertical geometry of the conductors within the inductor, which increase performance of the inductor. Additionally, the dielectric material may be selected to further increase the inductance of the inductor.

The embodiment 800 was illustrated with three successive damascene layers to form the coiled trace portion of the inductor. In some embodiments, the coiled section may comprise two damascene layers, or four or more damascene layers may be used. Three layers were used for illustration purposes only and are not intended to limit the present invention to the exact embodiment shown.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A capacitor in an integrated circuit comprising:
    a first signal trace and a second signal trace fabricated in at least one signal layer, said signal layer having a first dielectric material;
    at least two electrodes, each electrode being formed in a plurality of successive electrode layers comprising a second dielectric material;
    said electrodes being comprised of conductors formed in said successive layers, each of said conductors having a top surface and a bottom surface wherein said bottom surface is conterminous with said top surface for each of said successive layers; and
    wherein said first signal trace and said second signal trace are connected to alternating electrodes.

2. The capacitor of claim 1 further comprising:
    wherein said first dielectric material being selected to minimize capacitive coupling between said signal traces; and
    wherein said second dielectric material being selected to maximize capacitive coupling between said signal traces.

3. The capacitor of claim 1 wherein said first dielectric material and said second dielectric material are the same dielectric material.

4. An inductor in an integrated circuit comprising:
    successive layers comprising a top layer, at least one intermediate layer, and a bottom layer;
    said intermediate layer comprising a plurality of concentric loops, each loop being disunited at two points substantially opposite each other;
    said loops being comprised of conductors formed in said successive layers, each of said conductors having a top surface and a bottom surface wherein said bottom surface is conterminous with said top surface for each of said successive layers; and
    said top layer further comprising at least one trace connecting at least two of said concentric loops.

5. An inductor in an integrated circuit comprising:
    a coiled trace formed in a plurality of successive layers, said coiled trace being comprised of conductors in successive layers, each of said conductors having a top surface and a bottom surface wherein said bottom surface is conterminous with said top surface for each of said successive layers, said layers further comprising a first non-conductive material, said coiled trace having a first end and a second end;
    a first signal trace and a second signal trace in a signal layer, said signal layer comprising a second non-conductive material;
    said first signal trace being in electrical communication with said first end of said coiled trace; and
    said second signal trace being in electrical communication with said second end of said coiled trace.

* * * * *